US010763177B1

(12) United States Patent
Zhang et al.

(10) Patent No.: US 10,763,177 B1
(45) Date of Patent: Sep. 1, 2020

(54) I/O DEVICE FOR GATE-ALL-AROUND TRANSISTORS

(71) Applicant: International Business Machines Corporation, Armonk, NY (US)

(72) Inventors: Jingyun Zhang, Albany, NY (US); Takashi Ando, Tuckahoe, NY (US); Choonghyun Lee, Rensselaer, NY (US); Alexander Reznicek, Troy, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/290,606

(22) Filed: Mar. 1, 2019

(51) Int. Cl.
*H01L 21/00* (2006.01)
*H01L 21/8234* (2006.01)
*H01L 27/088* (2006.01)
*H01L 21/28* (2006.01)

(52) U.S. Cl.
CPC ........... *H01L 21/823462* (2013.01); *H01L 21/823431* (2013.01); *H01L 27/0886* (2013.01); *H01L 21/28185* (2013.01)

(58) Field of Classification Search
CPC ..... H01L 21/823462; H01L 21/823431; H01L 27/0886
See application file for complete search history.

(56) References Cited

U.S. PATENT DOCUMENTS

| | | | |
|---|---|---|---|
| 6,388,327 B1 | 5/2002 | Giewont et al. | |
| 7,476,578 B1 | 1/2009 | Cheng et al. | |
| 9,653,537 B1 | 5/2017 | Jagannathan et al. | |
| 9,704,863 B1 | 7/2017 | Cheng et al. | |
| 9,721,897 B1 | 8/2017 | Cheng et al. | |
| 9,881,787 B2 | 1/2018 | Kao et al. | |
| 10,243,060 B2 * | 3/2019 | Chao | H01L 29/66553 |

(Continued)

OTHER PUBLICATIONS

Mertens et al., "Vertically Stacked Gate-All-Around Si Nanowire CMOS Transistors with Dual Work Function Metal Gates," 2016 IEEE International Electron Devices Meeting (IEDM) (Dec. 2016) (4 pages).

(Continued)

*Primary Examiner* — Laura M Menz
(74) *Attorney, Agent, or Firm* — Vazken Alexanian; Michael J. Chang, LLC

(57) ABSTRACT

I/O devices for gate-all-around transistors are provided. In one aspect, a method of forming an integrated circuit includes: forming at least first/second logic and I/O device stacks on a wafer having nanosheets of a channel material; forming an IL oxide on the nanosheets in the first and second device stacks; depositing a gate dielectric on the nanosheets in the first and second device stacks; selectively forming an oxygen containing layer on the second device stack; depositing a sacrificial layer onto the nanosheets and onto the oxygen containing layer; depositing a barrier layer onto the first and second device stacks; annealing the first and second device stacks to drive oxygen atoms from the oxygen containing layer into the IL oxide in the second device stack; removing the oxygen containing layer, sacrificial layer and barrier layer; and depositing a conformal gate conductor over the gate dielectric. An integrated circuit is also provided.

20 Claims, 8 Drawing Sheets

(56) References Cited

U.S. PATENT DOCUMENTS

| | | | | |
|---|---|---|---|---|
| 10,332,962 B2* | 6/2019 | Miao | .................... | H01L 29/1033 |
| 10,403,738 B1* | 9/2019 | Sung | .................... | H01L 21/0217 |
| 10,446,664 B1* | 10/2019 | Cheng | ................. | H01L 29/0673 |
| 10,553,679 B2* | 2/2020 | Zhang | ................. | H01L 21/2236 |
| 10,615,258 B2* | 4/2020 | Miao | ................. | H01L 21/02587 |
| 2011/0127590 A1 | 6/2011 | Binder et al. | | |
| 2014/0099785 A1 | 4/2014 | Mujumdar et al. | | |
| 2018/0006159 A1 | 1/2018 | Guillorn et al. | | |
| 2018/0069000 A1* | 3/2018 | Bergendahl | ......... | H01L 27/0886 |
| 2018/0277656 A1* | 9/2018 | Chao | ................. | H01L 21/02255 |
| 2019/0109191 A1* | 4/2019 | Miao | .................... | H01L 29/0653 |
| 2019/0181224 A1* | 6/2019 | Zhang | .............. | H01L 21/02532 |
| 2019/0189741 A1* | 6/2019 | Miao | ................. | H01L 29/66469 |
| 2019/0296127 A1* | 9/2019 | Cheng | .................... | B82Y 10/00 |
| 2019/0393306 A1* | 12/2019 | Zhang | .............. | H01L 21/28518 |
| 2019/0393345 A1* | 12/2019 | Cheng | ................. | H01L 29/1037 |
| 2020/0006577 A1* | 1/2020 | Ching | ................. | H01L 29/0673 |
| 2020/0052132 A1* | 2/2020 | Ching | ................. | H01L 29/6653 |
| 2020/0066712 A1* | 2/2020 | Hafez | ................... | H01L 29/785 |
| 2020/0083222 A1* | 3/2020 | Kim | ...................... | H01L 29/785 |
| 2020/0091288 A1* | 3/2020 | Lee | .................... | H01L 29/6656 |

OTHER PUBLICATIONS

Braic et al., "Preparation and characterization of titanium oxynitride thin films," Applied Surface Science 253, pp. 8210-8214 (Mar. 2007).

Xiao et al., "Tantalum (Oxy)Nitride: Narrow Bandgap Photocatalysts for Solar Hydrogen Generation," Engineering 3, pp. 365-378 (May 2017).

\* cited by examiner

US 10,763,177 B1

I/O DEVICE FOR GATE-ALL-AROUND TRANSISTORS

FIELD OF THE INVENTION

The present invention relates to circuit designs having input/output (I/O) and logic devices, and more particularly, to improved I/O device designs for gate-all-around (GAA) transistors and techniques for fabrication thereof without degrading logic device performance.

BACKGROUND OF THE INVENTION

Gate-all-around (GAA) field-effect transistors (FETs) like nanosheet-based devices provide better electro-static control. Thus, a GAA device architecture helps meet the requirements for further aggressive device scaling.

Input/output (I/O) devices are an important component in many circuit designs. Traditionally, I/O devices have a thick gate dielectric which is formed by thermal oxidation of silicon. However, in nanosheet-based FETs, there is oftentimes not enough room to grow a thick oxide for I/O devices, since doing so will also increase gate dielectric thickness at the logic device region which will degrade device performance.

Accordingly, techniques for forming an I/O device having a thick gate dielectric without degrading gate stack quality in the logic device region would be desirable.

SUMMARY OF THE INVENTION

The present invention provides improved I/O device designs for gate-all-around (GAA) transistors and techniques for fabrication thereof without degrading logic device performance. In one aspect of the invention, a method of forming an integrated circuit is provided. The method includes: forming device stacks on a wafer having nanosheets of a channel material, wherein the device stacks include at least a first device stack and a second device stack, wherein the first device stack is a logic device stack, and wherein the second device stack is an input/output (I/O) device stack; forming an interfacial layer (IL) oxide on the nanosheets of the channel material in the first device stack and in the second device stack; depositing a conformal gate dielectric on the nanosheets of the channel material in the first device stack and in the second device stack over the IL oxide; selectively forming an oxygen containing layer on the second device stack that pinches off a channel-to-channel space between the nanosheets of the channel material in the second device stack; depositing a sacrificial layer onto the nanosheets of the channel material in the first device stack and onto the oxygen containing layer in the second device stack; depositing a barrier layer onto and encapsulating the first device stack and the second device stack; annealing the first device stack and the second device stack under conditions sufficient to drive oxygen atoms from the oxygen containing layer into the IL oxide in the second device stack; removing i) the sacrificial layer and barrier layer from the first device stack, and ii) the oxygen containing layer, sacrificial layer and barrier layer from the second device stack; and depositing a conformal gate conductor over the gate dielectric in the first device stack and in the second device stack.

In another aspect of the invention, an integrated circuit is provided. The integrated circuit includes: device stacks having nanosheets of a channel material disposed on a wafer, wherein the device stacks include at least a first device stack and a second device stack, wherein the first device stack is a logic device stack, and wherein the second device stack is an I/O device stack; an IL oxide formed on the nanosheets of the channel material in the first device stack and in the second device stack, wherein the IL oxide formed on the nanosheets of the channel material in the first device stack has a thickness T1 and the IL oxide formed on the nanosheets of the channel material in the second device stack has a thickness T2, wherein T2>T1; a conformal gate dielectric disposed on the nanosheets of the channel material in the first device stack and in the second device stack over the IL oxide; and a conformal gate conductor disposed over the gate dielectric in the first device stack and in the second device stack, wherein the conformal gate conductor surrounds a portion of each of the nanosheets of the channel material in the first device stack and in the second device stack in a gate-all-around configuration.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for achieving input/output (I/O) devices without degrading logic device performance. Advantageously, the present techniques are fully complementary-metal oxide semiconductor (CMOS)-process-compatible.

As will be described in detail below, the present techniques employ a pinch-off technique with an oxygen rich sacrificial material (e.g., oxygen rich titanium nitride (TiN)) to increase the thickness of the dielectric for the I/O device region (selective to the logic devices). Thus, in the example that follows, at least one logic device and at least one I/O device will be formed on a common wafer.

Figure 1:
FIG. 1 is a cross-sectional diagram illustrating a stack of (sacrificial/channel) nanosheets having been formed on a wafer according to an embodiment of the present invention.
Figure 2:
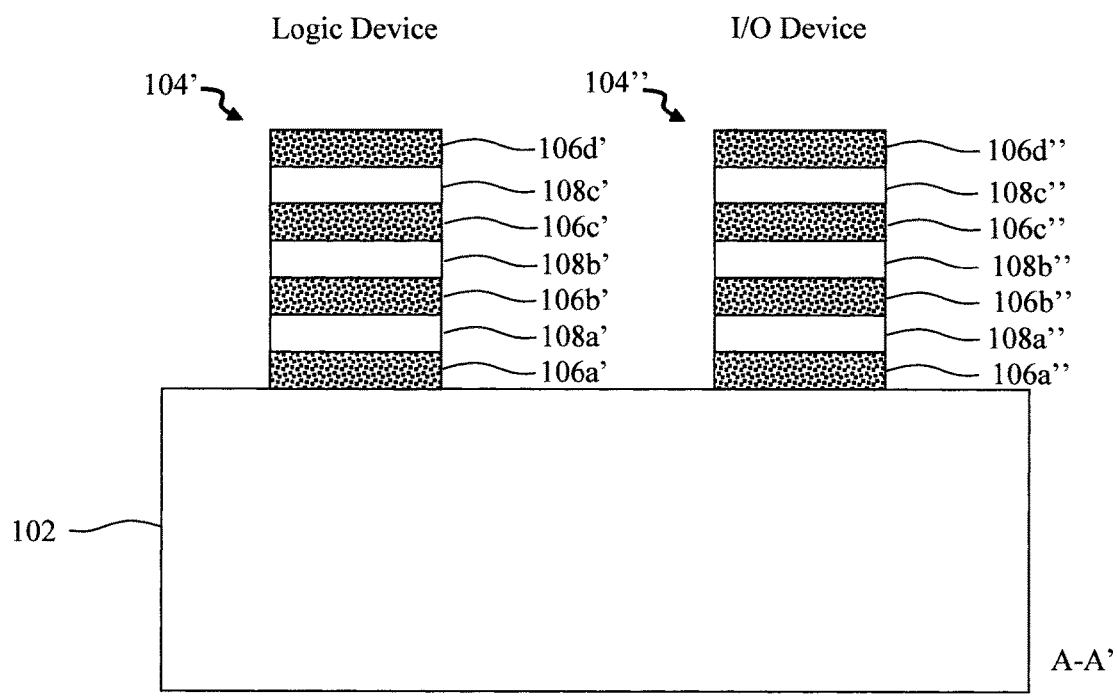
FIG. 2 is a cross-sectional diagram illustrating the stack having been patterned into at least one (first) logic device stack and at least one (second) I/O device stack according to an embodiment of the present invention.
Figure 3:
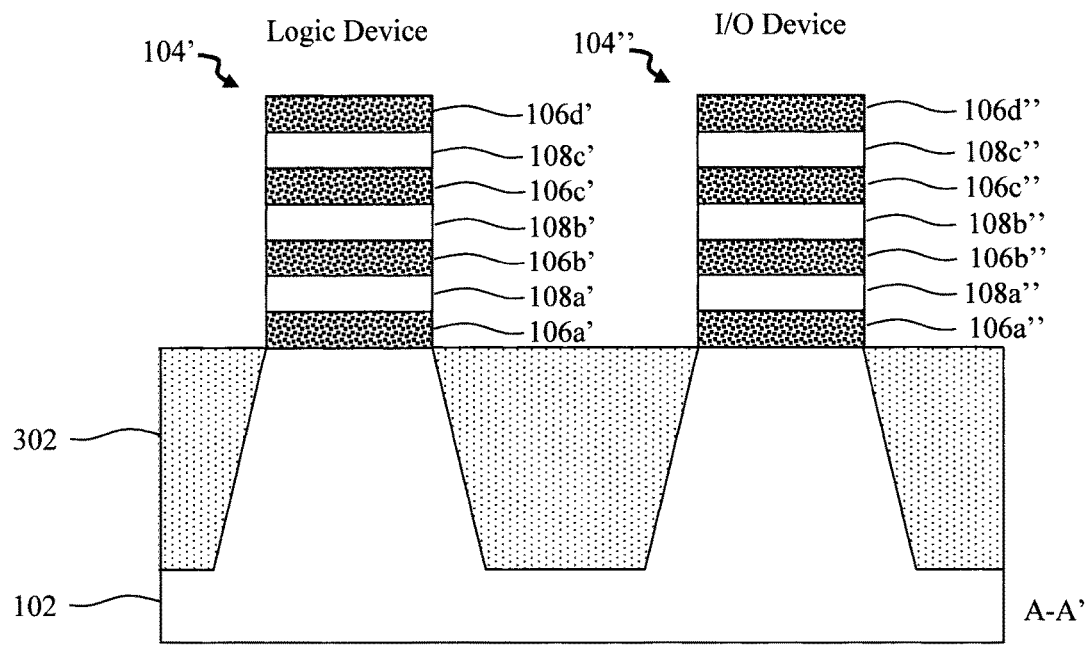
FIG. 3 is a cross-sectional diagram illustrating shallow trench isolation (STI) regions having been formed in the wafer at the base of the (first) logic device stack and (second) I/O device stack according to an embodiment of the present invention.

An exemplary methodology for forming an integrated circuit having a logic device(s) and an I/O device(s) is now described by way of reference to FIGS. 1-16. As shown in FIG. 1, the process begins by forming a stack 104 of nanosheets on a wafer 102. See FIG. 1. The term 'nanosheet,' as used herein, refers to a sheet or a layer having nanoscale dimensions. Further, the term nanosheet may also be used interchangeably herein with the term 'nanowire' when referring to a particular structure. For instance, nanosheet can be used to refer to a nanowire with a larger width, and/or nanowire may be used to refer to a nanosheet with a smaller width, and vice versa.

As shown in FIG. 1, the stack 104 includes alternating layers of nanosheets of a sacrificial material 106a,b,c, etc. and a channel material 108a,b,c,etc. By 'sacrificial' it is meant that material 106a,b,c,etc. will be selectively removed from stack 104 later in the process, releasing the nanosheets of channel material 108a,b,c, etc. from the stack 104.

According to an exemplary embodiment, wafer 102 is a bulk semiconductor wafer. Suitable bulk semiconductor wafers include, but are not limited to, bulk wafers of silicon (Si), strained Si, silicon carbide (SiC), germanium (Ge), silicon germanium (SiGe), silicon-germanium-carbon (Si-GeC), Si alloys, Ge alloys, gallium arsenide (GaAs), indium arsenide (InAs) and/or indium phosphide (InP).

Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

According to an exemplary embodiment, epitaxy is used to grow alternating (epitaxial) nanosheets of the sacrificial material 106a,b,c, etc. and channel material 108a,b,c,etc. as the stack 104 on wafer 102. Notably, the selection of the sacrificial and active materials needs to permit selective removal of one material relative to the other. For instance, SiGe and Si offer etch selectivity, whereby selective etch chemistries can be chosen to remove SiGe or Si selective to the other. Thus, according to one exemplary embodiment, SiGe is chosen as the sacrificial material and Si as the channel material. However, embodiments are contemplated herein where the functionalities of these materials are reversed, and Si serves as the sacrificial material and SiGe as the active material.

In the example shown in FIG. 1, the first nanosheet in stack 104 is a (epitaxial) nanosheet of sacrificial material 106a. A nanosheet of the channel material 108a is then epitaxially grown on the sacrificial material 106a, and so on. According to an exemplary embodiment, each of the (sacrificial/channel) nanosheets in stack 104 have a thickness of from about 5 nanometers (nm) to about 20 nm and ranges therebetween.

The number of (sacrificial/channel) nanosheets shown in stack 104 is an example meant merely to illustrate the present techniques. In accordance with the present techniques, stack 104 can include more or fewer (sacrificial/channel) nanosheets than shown. Advantageously, varying the stack height to increase/decrease the number of nanosheets of the channel material can be used to tune the (logic, I/O) device characteristics without changing the overall footprint of each device, which helps meet the requirements for further aggressive device scaling.

Standard lithography and etching techniques are then used to pattern stack 104 into at least one logic device stack 104' and at least one I/O device stack 104". See FIG. 2. The at least one logic device stack 104' may also be referred to herein as a "first" device stack, and the at least one I/O device stack 104" may also be referred to herein as a "second" device stack. A directional (anisotropic) etching process such as reactive ion etching (RIE) can be used for the device stack etch. Each device stack 104'/104" includes patterned portions of the nanosheets of the sacrificial material 106a,b,c, etc. and channel material 108a,b,c,etc. These patterned portions of the nanosheets in the logic device stack 104' and I/O device stack 104" are now given the reference numerals 106/108a',b',c', etc. and 106/108a",b",c"', etc., respectively. See FIG. 2.

A shallow trench isolation (STI) process is then used to form STI regions 302 in the wafer 102 at the base of the logic device stack 104' and I/O device stack 104". See FIG. 3. STI generally involves patterning trenches in the wafer 102 in between the logic device stack 104' and I/O device stack 104", and then filling the trenches with an insulator such as an STI oxide material.

Generally, each logic and I/O device is a transistor having a source region and a drain region interconnected by a channel region (i.e., the nanosheets of channel material), and a gate that fully surrounds a portion of each of the nanosheets of channel material in a gate-all-around (GAA) configuration. The gate regulates electron flow through the channel region. In the present example, a gate-last, replacement metal gate or RMG process flow is employed whereby a sacrificial or 'dummy gate' is placed over the channel region early in the process which enables placement of the source and drain regions. The dummy gate is subsequently removed and replaced with a high-κ dielectric/metal gate. Advantageously, a gate-last process avoids exposure of high-κ dielectric/metal gate to potentially damaging conditions such as high processing temperatures that can impact device performance. This is because the high-κ dielectric/metal gate are placed only toward the end of the process.

Thus, according to an exemplary embodiment, a dummy gate 402 is next formed over the logic device stack 104' and I/O device stack 104". See FIG. 4. The dummy gate 402 covers the portions of the logic device stack 104' and I/O device stack 104" that will be used to form the channel regions of the logic and I/O devices, respectively. See also FIG. 5, described below.

Dummy gate 402 is formed by blanket depositing a suitable dummy gate material over the logic device stack 104' and I/O device stack 104", and then using standard lithography and etching techniques to pattern the dummy gate material into the dummy gate 402. Suitable dummy gate materials include, but are not limited to, poly-silicon (poly-Si) and/or amorphous silicon (a-Si).

Figure 4:
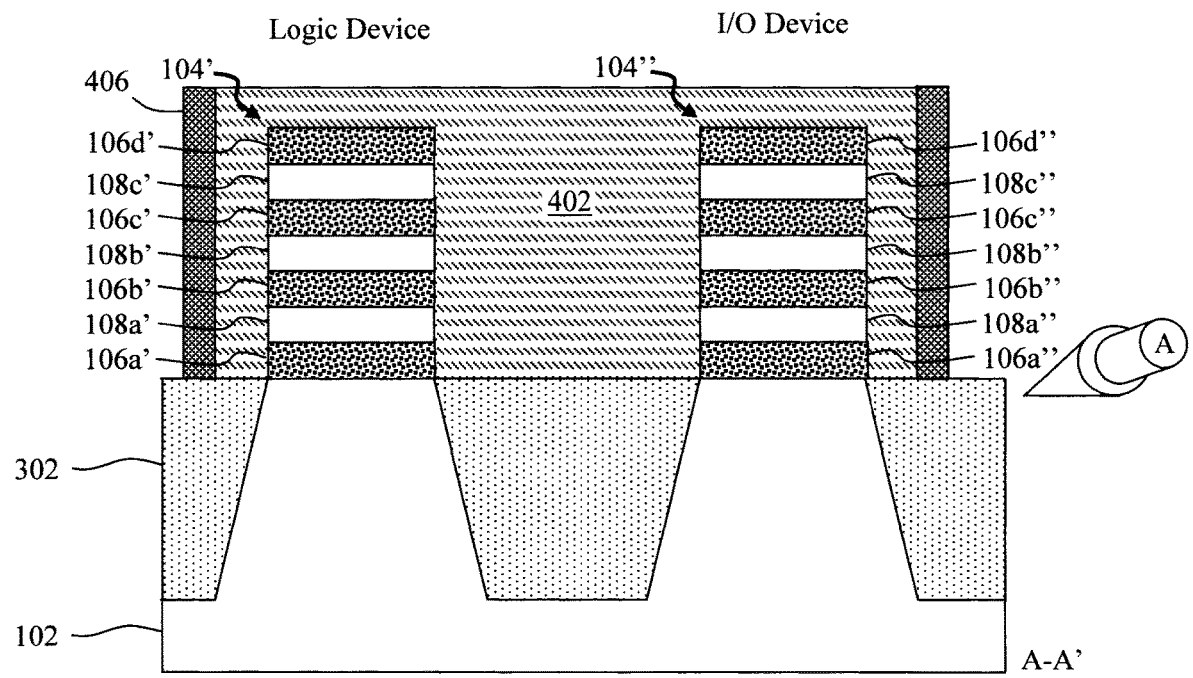
FIG. 4 is a cross-sectional diagram illustrating dummy gates having been formed over the (first) logic device stack and (second) I/O device stack, and dummy gate spacers having been formed on opposite sides of the dummy gates according to an embodiment of the present invention.

As shown in FIG. 4, dummy gate spacers 406 are then formed on opposite sides of the dummy gate 402. The dummy gate spacers 406 are formed on all sides of the dummy gate 402 and will serve to offset the dummy gate 402 from what will be the source and drain regions of each logic and I/O device. See also FIG. 5, described below. The dummy gate spacers 406 can be formed by blanket depositing a suitable spacer material over the dummy gate 402 and then using a directional (anisotropic) etching process such as RIE to clear all but the spacer material along the sidewalls of the dummy gate 402. Suitable spacer materials include, but are not limited to, nitride spacer materials such as silicon nitride (SiN).

Figure 5:
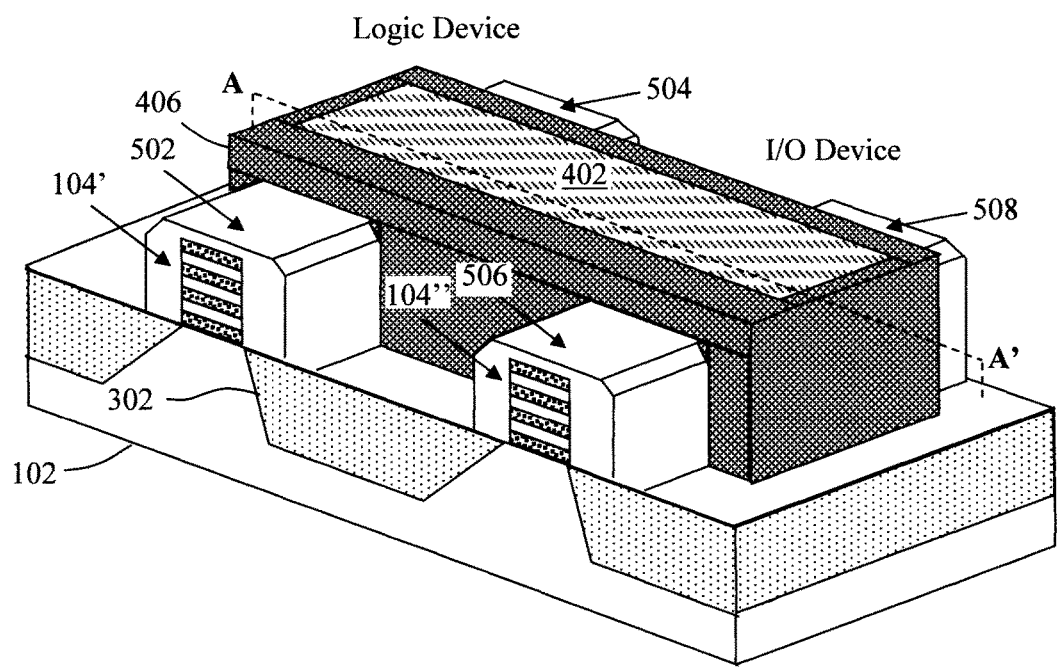
FIG. 5 is a three-dimensional diagram illustrating doped source and drain regions having been formed on opposite ends of the (first) logic device stack and (second) I/O device stack according to an embodiment of the present invention.
Figure 6:
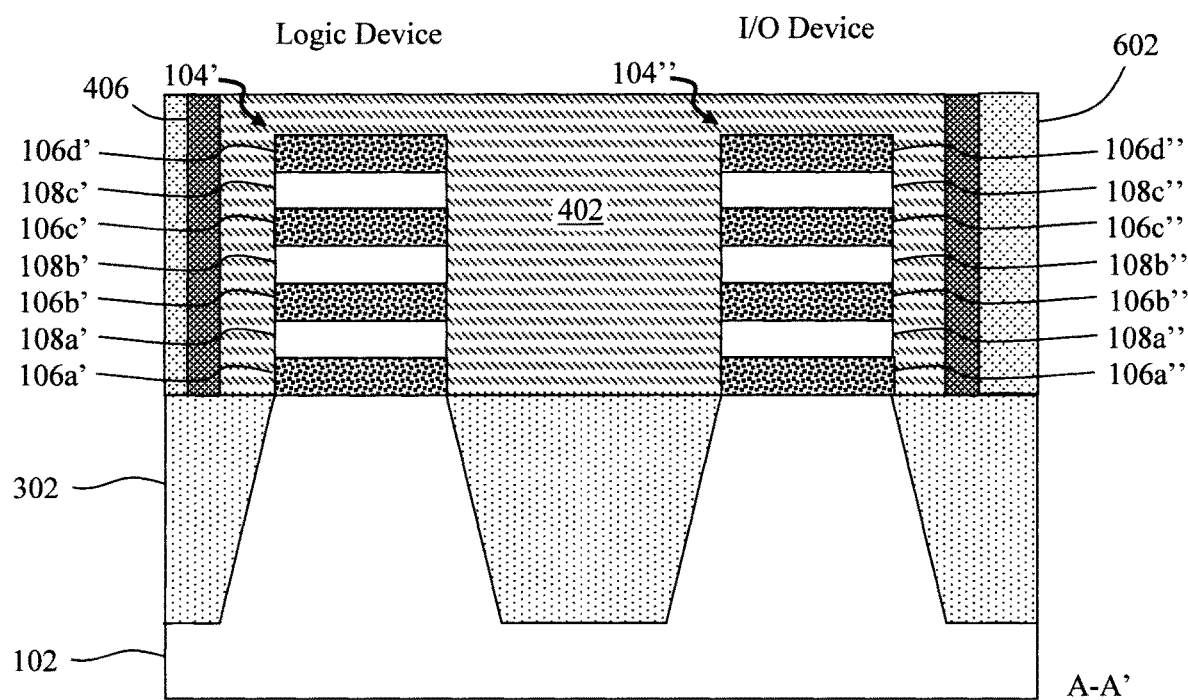
FIG. 6 is a cross-sectional diagram illustrating the dummy gates having been buried in a dielectric fill material according to an embodiment of the present invention.
Figure 7:
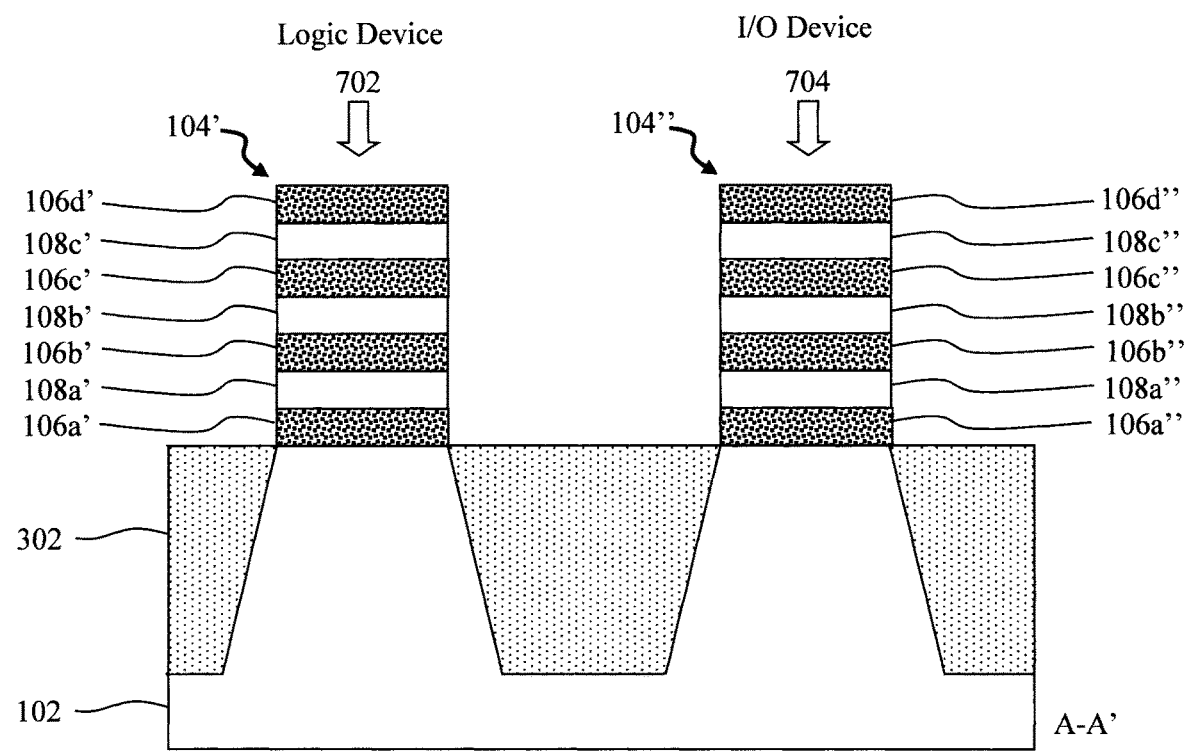
FIG. 7 is a cross-sectional diagram illustrating the dummy gates having been removed selective to the dielectric fill material and dummy gate spacers according to an embodiment of the present invention.
Figure 8:
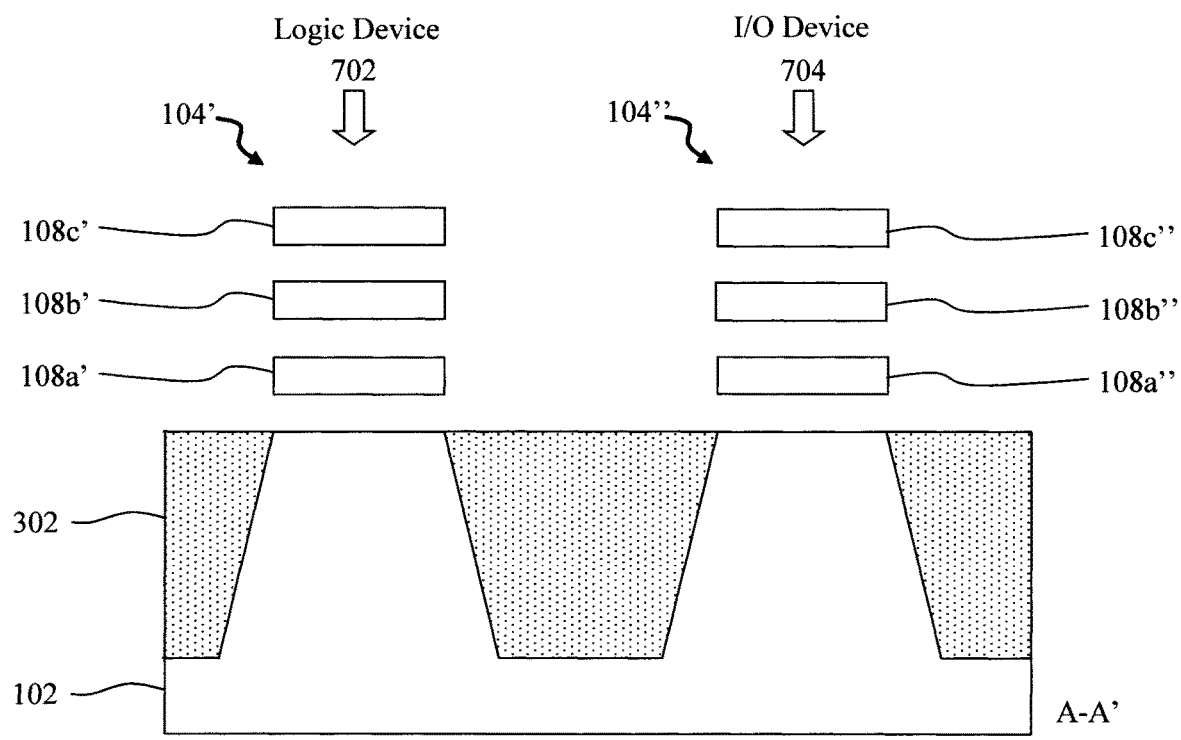
FIG. 8 is a cross-sectional diagram illustrating the nanosheets of the sacrificial material having been selectively removed from the (first) logic device stack and (second) I/O device stack according to an embodiment of the present invention.
Figure 9:
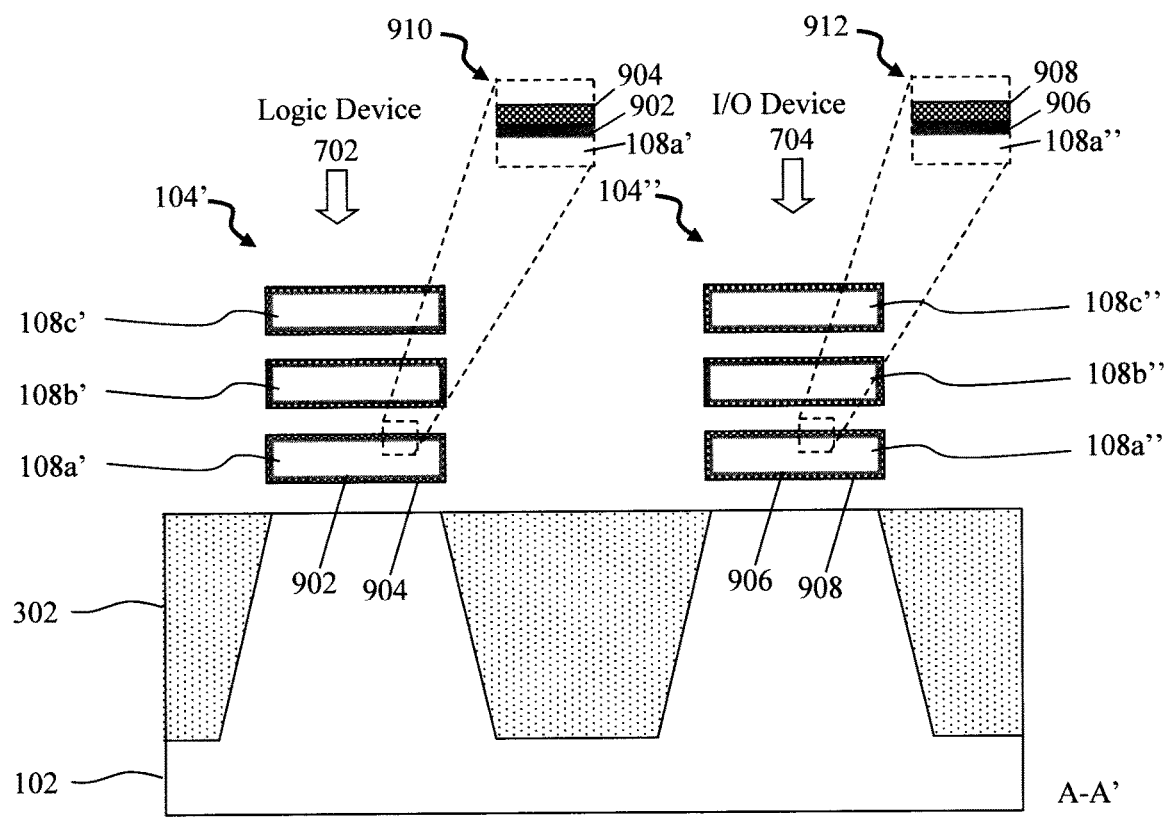
FIG. 9 is a cross-sectional diagram illustrating an interfacial layer (IL) oxide having been formed on exposed surfaces of the nanosheets of the channel material, and conformal gate dielectrics having been deposited over the IL oxide according to an embodiment of the present invention.

Switching to a three-dimensional view of the device (i.e., from a viewpoint A—see FIG. 4) shown in FIG. 5, doped source and drain regions 502/504 and 506/508 are formed on opposite ends of the logic device stack 104' and I/O device stack 104", respectively. The doped source and drain regions 502/504 and 506/508 are offset from the dummy gate 402 by dummy gate spacers 406. As shown in FIG. 5, and as highlighted above, dummy gate 402 covers the portions of the logic device stack 104' and I/O device stack 104" that will be used to form the channel regions of the logic and I/O devices, respectively. Further, as shown in FIG. 5 and as highlighted above, dummy gate spacers 406 are formed on all four sides of the dummy gate 402 and serve to offset the dummy gate 402 from the source and drain regions of each logic and I/O device.

According to an exemplary embodiment, doped source and drain regions 502/504 and 506/508 are formed from an in-situ doped epitaxial material such as in-situ doped epitaxial Si SiC or SiGe. Suitable n-type dopants include but are not limited to phosphorous (P) and/or arsenic (As), and suitable p-type dopants include but are not limited to boron (B). The use of an in-situ doping process is merely an example. For instance, one may instead employ an ex-situ process such as ion implantation to introduce dopants into doped source and drain regions 502/504 and 506/508.

The doped source and drain regions 502/504 and 506/508 are now present anchoring the ends of the logic device stack 104' and I/O device stack 104", respectively. This configuration will enable the nanosheets of the channel material 108a',b',c',etc./108a",b",c",etc. to be released from the logic device stack 104' and I/O device stack 104" in the channel regions of the logic and I/O devices by selective removal of the nanosheets of the sacrificial material 106a',b',c',etc./106a",b",c",etc. As a result, the nanosheets of the channel material 108a',b',c',etc./108a",b",c",etc. will be suspended in the channel regions of the I/O and logic devices, but anchored at their ends under the doped source and drain regions 502/504 and 506/508. Further, the nanosheets of the sacrificial material covered by the doped source and drain regions 502/504 and 506/508 do not get removed. Thus, portions of the nanosheets of the sacrificial material 106a',b',c',etc./106a",b",c",etc. remain intact under the doped source and drain regions 502/504 and 506/508 in the final end-product devices.

Referring again to cross-sectional views A-A' (see FIG. 5) of the device structure, the dummy gate 402 is then buried in a dielectric fill material 602. See FIG. 6. Dielectric fill material 602 can be deposited using a process such as chemical vapor deposition (CVD), atomic layer deposition (ALD) or physical vapor deposition (PVD). Suitable dielectric fill materials 602 include, but are not limited to, silicon dioxide ($SiO_2$) and/or organic planarizing layer (OPL) materials.

Deposition of dielectric fill material 602 will permit removal of the dummy gate 402 from the channel regions of the logic and I/O devices, release of the nanosheets of channel material from the logic device stack 104' and I/O device stack 104", and the formation of a (e.g., GAA) replacement metal gate over the channel regions of the logic and I/O devices. Following deposition of dielectric fill material 602, a polishing process such as chemical mechanical polishing (CMP) can be employed to expose the top of the dummy gate 402 (see FIG. 6), thereby enabling its (selective) removal.

The dummy gate 402, the dielectric fill material 602, and dummy gate spacers 406 are then removed exposing portions of the logic device stack 104' and I/O device stack 104" in the channel regions of the logic and I/O devices. See FIG. 7. As will be described in detail below, replacement metal gates will be formed to replace the dummy gate 402. A selective etch or series of selective etch steps can be employed to remove the dummy gate 402, the dielectric fill material 602, and dummy gate spacers 406.

The nanosheets of the sacrificial material 106a',b',c',etc./106a",b",c",etc. are then selectively removed from logic device stack 104' and I/O device stack 104" in the channel regions of the logic and I/O devices, respectively. See FIG. 8. As a result, the nanosheets of the channel material 108a',b',c',etc./108a",b",c",etc. will be suspended in the channel regions of the I/O and logic devices. As provided above, the nanosheets of the channel material 108a',b',c', etc./108a",b",c",etc. are anchored at their ends under the doped source and drain regions 502/504 and 506/508, where the nanosheets of the sacrificial material 106a',b',c',etc./106a",b",c",etc. remain intact.

As provided above, according to one exemplary embodiment, the sacrificial material is SiGe and the channel material is Si. In that case, etchants such as wet hot SC1, vapor phase hydrogen chloride (HCl), vapor phase chlorine trifluoride ($ClF_3$) and other reactive clean processes (RCP) can be employed to etch the sacrificial SiGe selective to the Si channels. For instance, see Mertens et al., "Vertically Stacked Gate-All-Around Si Nanowire CMOS Transistors with Dual Work Function Metal Gates," 2016 IEEE International Electron Devices Meeting (IEDM) (December 2016) (4 pages) (vapor phase HCl), the contents of which are incorporated by reference as if fully set forth herein. However, as provided above, the functions of these materials can be reversed, and embodiments are contemplated herein where the sacrificial material is Si and the channel material is SiGe. In that case, ammonium hydroxide ($NH_4OH$), tetraethylammonium hydroxide (TEAH) and/or tetraethylammonium hydroxide (TMAH) can be used to etch the sacrificial Si versus the SiGe channels.

An interfacial layer (IL) oxide 902/906 (e.g., $SiO_2$ which may include other chemical elements in it such as nitrogen, germanium, etc.) is next formed on exposed surfaces of the nanosheets of the channel material 108a',b',c',etc./108a",b", c",etc. in the channel regions of the logic and I/O devices, respectively. See FIG. 9. According to an exemplary embodiment, IL oxide 902/906 is formed by an oxidation process to a thickness of from about 0.3 nm to about 5 nm, and ranges therebetween, e.g., about 1 nm. At this point in the process, IL oxide 902 (logic device) and IL oxide 906 (I/O device) generally have the same thickness. However, steps will be taken later in the process to selectively increase the thickness of the IL oxide in the I/O device.

Conformal gate dielectrics 904/908 are then deposited onto the nanosheets of the channel material 108a',b',c',etc./ 108a",b",c",etc. over the IL oxide 902/906 in the channel regions of the logic and I/O devices, respectively. Suitable gate dielectrics 904/908 include, but are not limited to, high-κ gate dielectrics such as hafnium oxide ($HfO_2$) and/or lanthanum oxide ($La_2O_3$). The term "high-κ" as used herein refers to a material having a relative dielectric constant is which is much higher than that of silicon dioxide (e.g., a dielectric constant is =25 for hafnium oxide ($HfO_2$) rather than 4 for $SiO_2$). The gate dielectrics 904/908 can be deposited using a process such as CVD, ALD or PVD. According to an exemplary embodiment, the gate dielectrics 904/908 are each deposited to a thickness of from about 2 nm to about 10 nm and ranges therebetween. Enlarged views 910 and 912 of the IL oxide 902/906 and gate dielectrics 904/908 are provided in FIG. 9.

As highlighted above, steps will be taken to selectively thicken the IL oxide 906 in the I/O device. To do so, an oxygen containing layer 1002 is next deposited onto the logic device stack 104' and I/O device stack 104" surrounding the nanosheets of the channel material 108a',b',c',etc./ 108a",b",c",etc. in the channel regions of the logic and I/O devices, respectively. See FIG. 10. As will be described in detail below, this oxygen containing layer 1002 will be selectively removed from the logic device, but remain as an oxygen source for growing a thicker IL oxide 906 in the I/O device.

Figure 10:
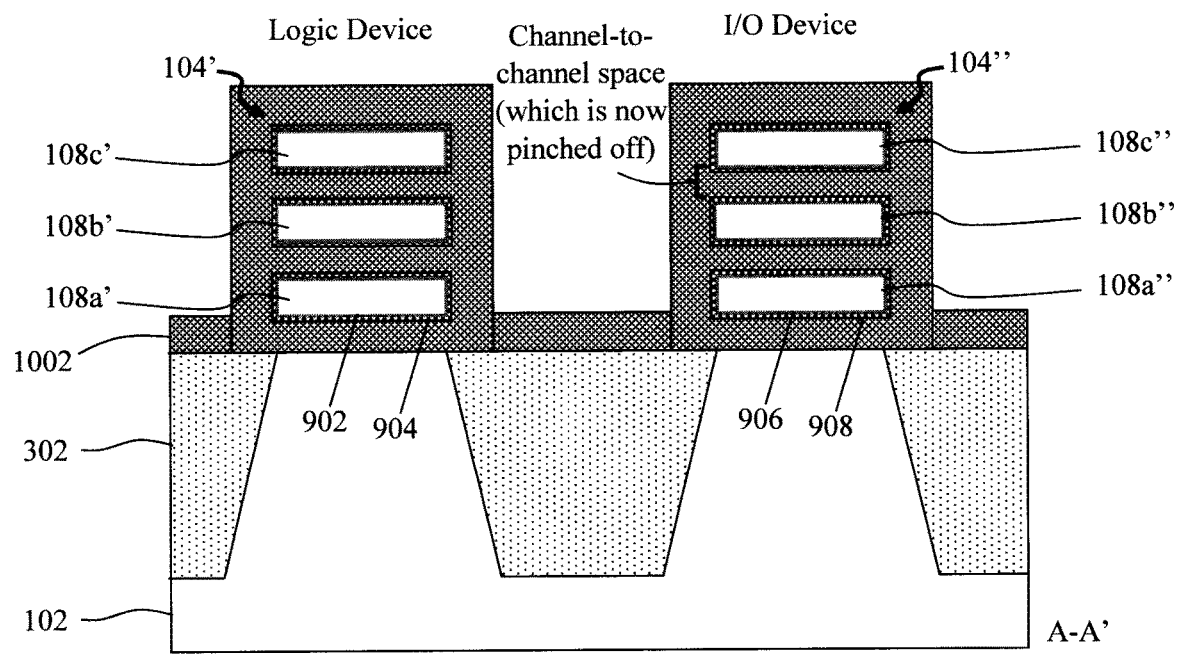
FIG. 10 is a cross-sectional diagram illustrating an oxygen containing layer having been deposited onto the (first) logic device stack and (second) I/O device stack surrounding the nanosheets of the channel material according to an embodiment of the present invention.

Notably, as shown in FIG. 10, oxygen containing layer 1002 is deposited thick enough to pinch off the space between the nanosheets of the channel material 108a',b',c', etc./108a",b",c",etc. (also referred to herein as "channel-to-channel space" in the logic device stack 104' and I/O device stack 104". Doing so prevents the deposition of any further materials in this channel-to-channel space of the I/O device stack 104" during subsequent processing steps such as sacrificial layer 1202 (see description of FIG. 12, below).

Suitable oxygen containing materials for layer 1002 include, but are not limited to, metal (oxy)nitrides such as titanium (oxy)nitride and/or tantalum (oxy)nitride. See, for example, Braic et al., "Preparation and characterization of titanium oxy-nitride thin films," Applied Surface Science 253, pp. 8210-8214 (March 2007) and Xiao et al., "Tantalum (Oxy)Nitride: Narrow Bandgap Photocatalysts for Solar Hydrogen Generation," Engineering 3, pp. 365-378 (May 2017), the contents of each of which is incorporated by reference as if fully set forth herein.

The oxygen containing layer 1002 can be conformally deposited using a process such as CVD, ALD, PVD, pulsed laser deposition (PLD), sputtering, etc. According to an exemplary embodiment, the oxygen containing layer 1002 is deposited to a thickness of from about 5 nm to about 15 nm and ranges therebetween, or until the channel-to-channel space is pinched off in the device stacks. By way of example only, if the channel-to-channel space is from about 5 nm to about 20 nm and ranges therebetween, then depositing the oxygen containing layer 1002 to a thickness of from about 5 nm to about 15 nm and ranges therebetween on the nanosheets of the channel material 108a',b',c',etc./108a",b", c",etc. above and below the channel-to-channel space will cause the layers to merge, pinching off the space.

Figure 11:
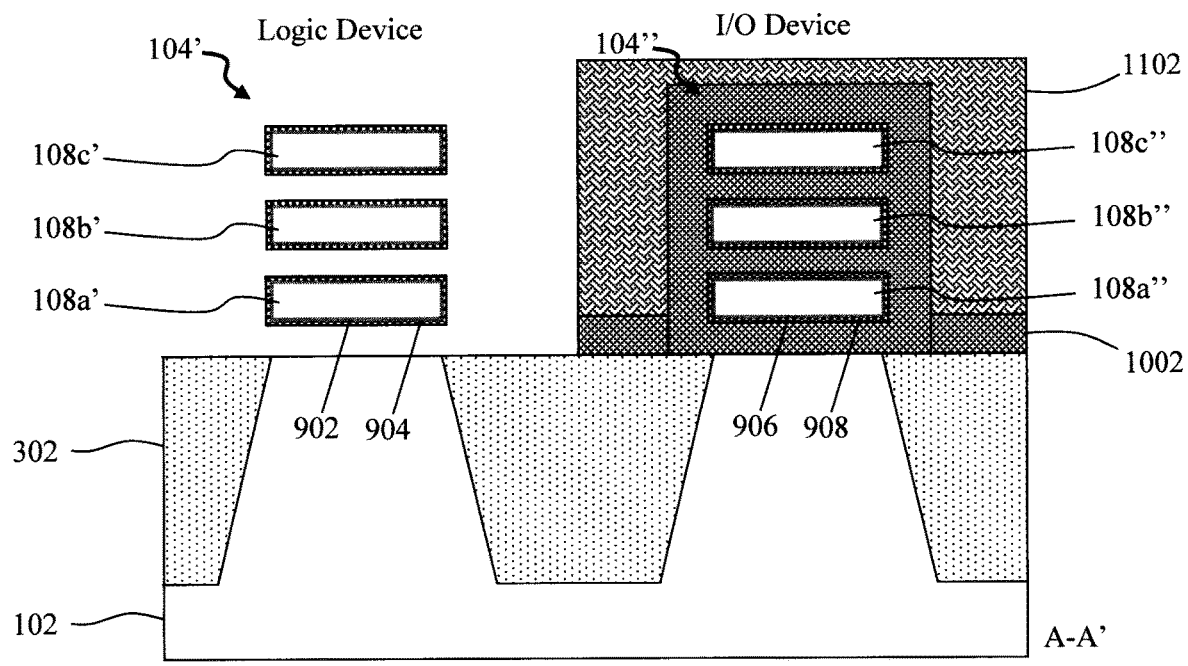
FIG. 11 is a cross-sectional diagram illustrating the oxygen containing layer having been selectively removed from the (first) logic device stack according to an embodiment of the present invention.

The next task is to selectively remove the oxygen containing layer 1002 from the logic device stack 104' (such that the oxygen containing layer 1002 remains in the I/O device stack 104"). See FIG. 11. According to an exemplary embodiment, the oxygen containing layer 1002 is selectively removed from the logic device stack 104' by first forming a standard block mask 1102 over/covering the I/O device stack 104". An etch such as a nitride-selective non-directional (isotropic) etch is then used to clear the oxygen containing layer 1002 from the logic device stack 104' (including from the channel-to-channel space between the nanosheets of the channel material 108a',b',c',etc.). Following the etch, the block mask 1102 is removed. As shown in FIG. 11, what remains is the oxygen containing layer 1002 surrounding the I/O device stack 104".

A thin, sacrificial layer 1202 is then deposited onto/ surrounding the nanosheets of the channel material 108a', b',c',etc. in the logic device stack 104' and over the oxygen containing layer 1002 in the I/O device stack 104". See FIG. 12. Layer 1202 will serve as a sacrificial layer in the logic device stack 104' between the gate dielectric 904 and a barrier layer 1302 that is subsequently deposited over the stacks (see description of FIG. 13, below). Layer 1202 is a sacrificial layer since it will be removed following the regrowth to thicken the IL oxide in the I/O device.

Suitable materials for the sacrificial layer 1202 include, but are not limited to, metal nitrides such as titanium nitride (TiN) and/or tantalum nitride (TaN). Here, however, these metal nitrides are not oxygen-containing materials. The barrier layer 1202 can be deposited using a conformal deposition process such as CVD, ALD or PVD. According to an exemplary embodiment, the barrier layer 1202 is deposited to a thickness of from about 2 nm to about 5 nm and ranges therebetween. Notably, the sacrificial layer 1202 needs to be thin enough so as not to pinch off the channel-to-channel space between the nanosheets of the channel material 108a',b',c',etc. in the logic device stack 104'. See FIG. 12 which illustrates that the sacrificial layer 1202 is conformal around each of the nanosheets of the channel material 108a',b',c',etc. in the logic device stack 104' but does not pinch off the channel-to-channel space. That way, space remains between the nanosheets of the channel material 108a',b',c',etc. in the logic device stack 104' for placement of the barrier layer 1302 (see the description of FIG. 13, below).

Figure 12:
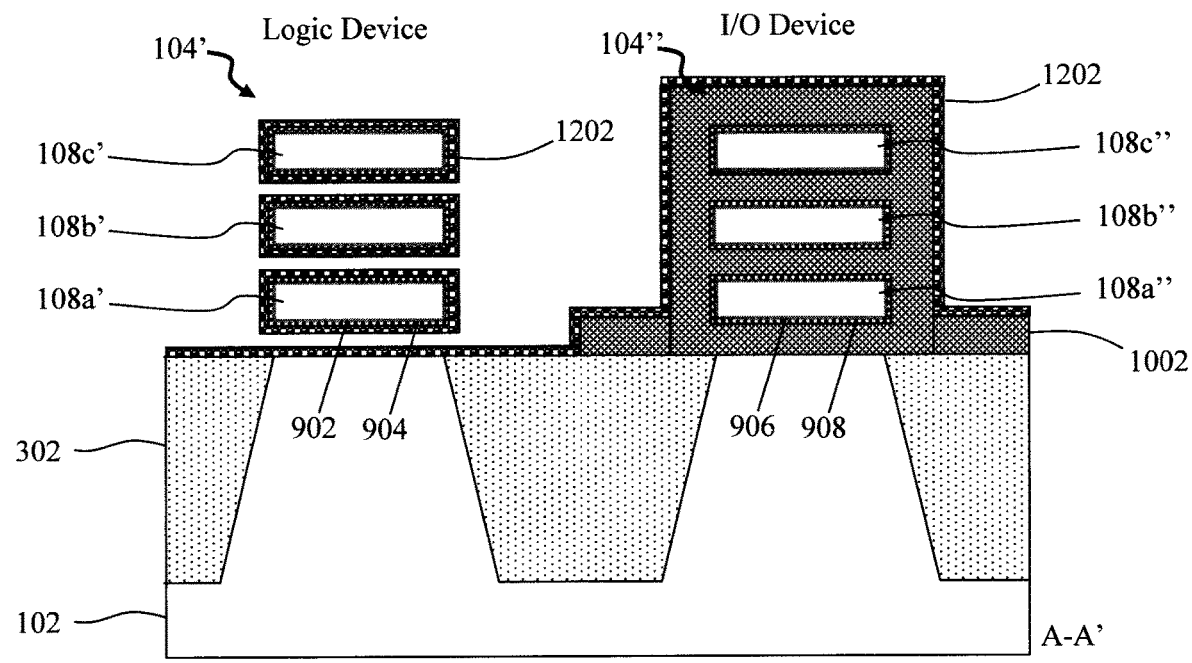
FIG. 12 is a cross-sectional diagram illustrating a sacrificial layer having been deposited onto the nanosheets of the channel material in the (first) logic device stack and over the oxygen containing layer in the (second) I/O device stack according to an embodiment of the present invention.
Figure 13:
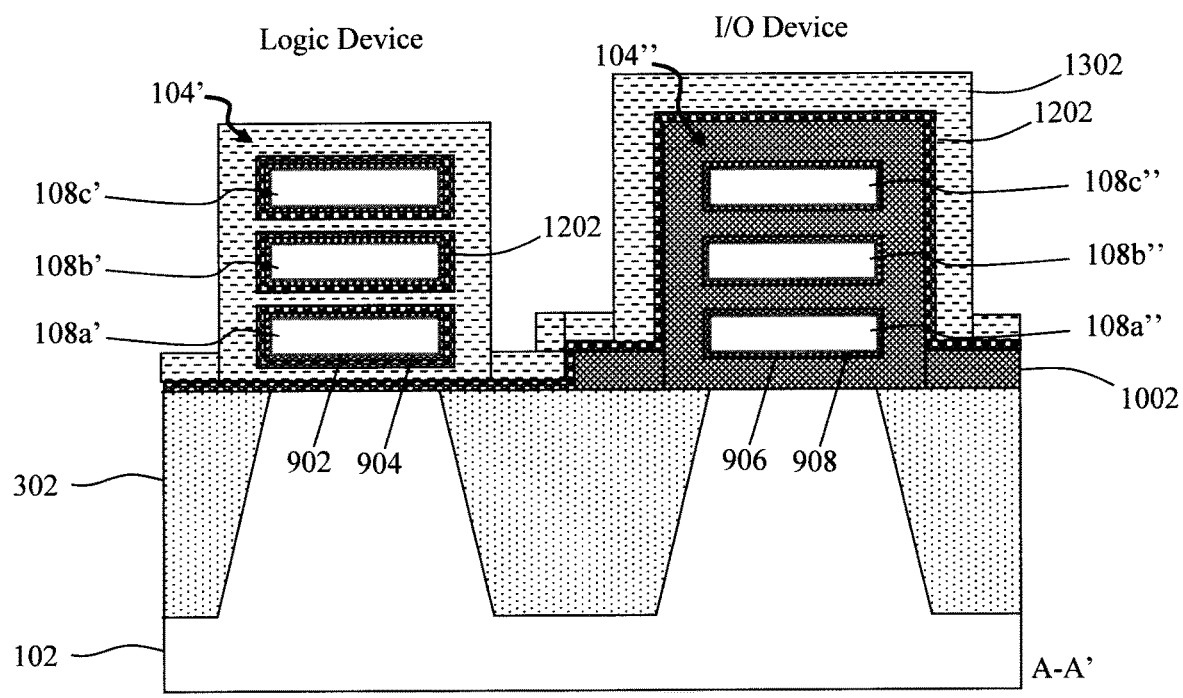
FIG. 13 is a cross-sectional diagram illustrating a barrier layer having been deposited over, and encapsulating, the (first) logic device stack and (second) I/O device stack according to an embodiment of the present invention.

It is further notable that, as described above, the channel-to-channel space between the nanosheets of the channel material 108a",b",c",etc. in the I/O device stack 104" has already been pinched off by the oxygen containing layer 1002. Thus, the sacrificial layer 1202 is blocked from the channel-to-channel space between the nanosheets of the channel material 108a",b",c",etc. in the I/O device stack 104". As such, the sacrificial layer 1202 simply deposits on top of the oxygen containing layer 1002 as shown in FIG. 12.

A barrier layer 1302 is then deposited over, and encapsulating, the logic device stack 104' and I/O device stack 104". See FIG. 13. Barrier layer 1302 serves to block oxygen from the environment from reaching the device stacks during a subsequent anneal (see FIG. 14, described below). Namely, the goal is to thicken the IL oxide in the I/O device while the IL oxide in the logic device remains unchanged. Thus, the oxygen containing layer 1002 (which is now present only in the I/O device stack 104") needs to be the only oxygen source for this regrowth.

Suitable materials for the barrier layer 1302 include, but are not limited to, poly-Si and/or a-Si. The barrier layer 1302 can be deposited using a process such as CVD, ALD or PVD. According to an exemplary embodiment, barrier layer 1302 is deposited to a thickness of from about 10 nm to about 20 nm and ranges therebetween. At these thicknesses, the barrier layer 1302 should fully pinch off the remaining the channel-to-channel space between the nanosheets of the channel material 108a',b',c',etc. in the logic device stack 104'. See FIG. 13. In the I/O device stack 104", the barrier layer 1302 simply deposits on top of and encapsulating the oxygen containing layer 1002.

Figure 14:
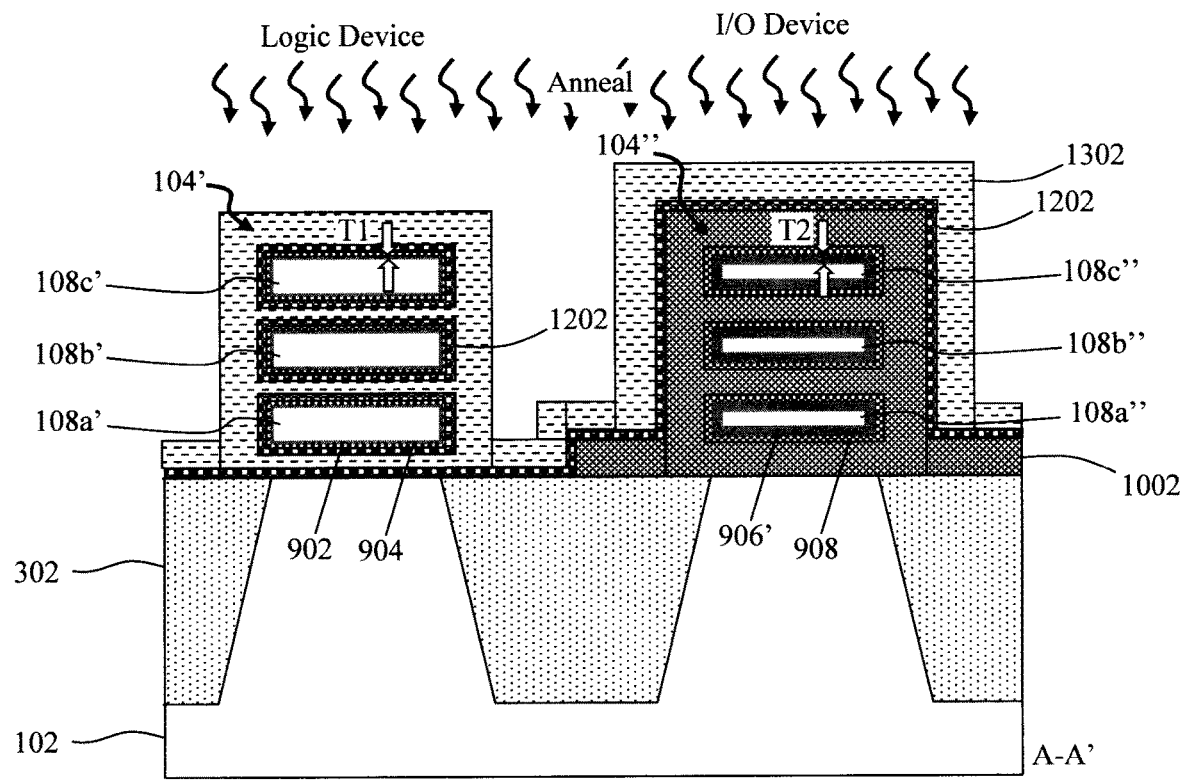
FIG. 14 is a cross-sectional diagram illustrating an anneal of the device stacks being performed to drive oxygen atoms from the oxygen containing layer into the IL oxide of the (second) I/O device stack according to an embodiment of the present invention.

An anneal of the device stacks is next performed under conditions sufficient to drive oxygen atoms from the oxygen containing layer 1002 into the IL oxide 906 of the I/O device stack 104". See FIG. 14. As shown in FIG. 14, this drive-in anneal causes regrowth/thickening of the IL oxide of the I/O device stack 104" (now given reference numeral 906'). For instance, by way of example only, IL oxide 906' now has a thickness of from about 2 nm to about 10 nm, and ranges therebetween. As shown in FIG. 14, IL oxide 906' of the I/O device stack 104" is now thicker than the IL oxide 902 of the logic device stack 104', i.e., IL oxide 906' of the I/O device stack 104" has a thickness T1, and IL oxide 902 of the logic device stack 104' has a thickness T2, wherein T2>T1. According to an exemplary embodiment, the conditions include a temperature of from about 850 degrees Celsius (° C.) to about 1050° C. and ranges therebetween, and a duration of from about 1 second to about 120 seconds and ranges therebetween.

Figure 15:
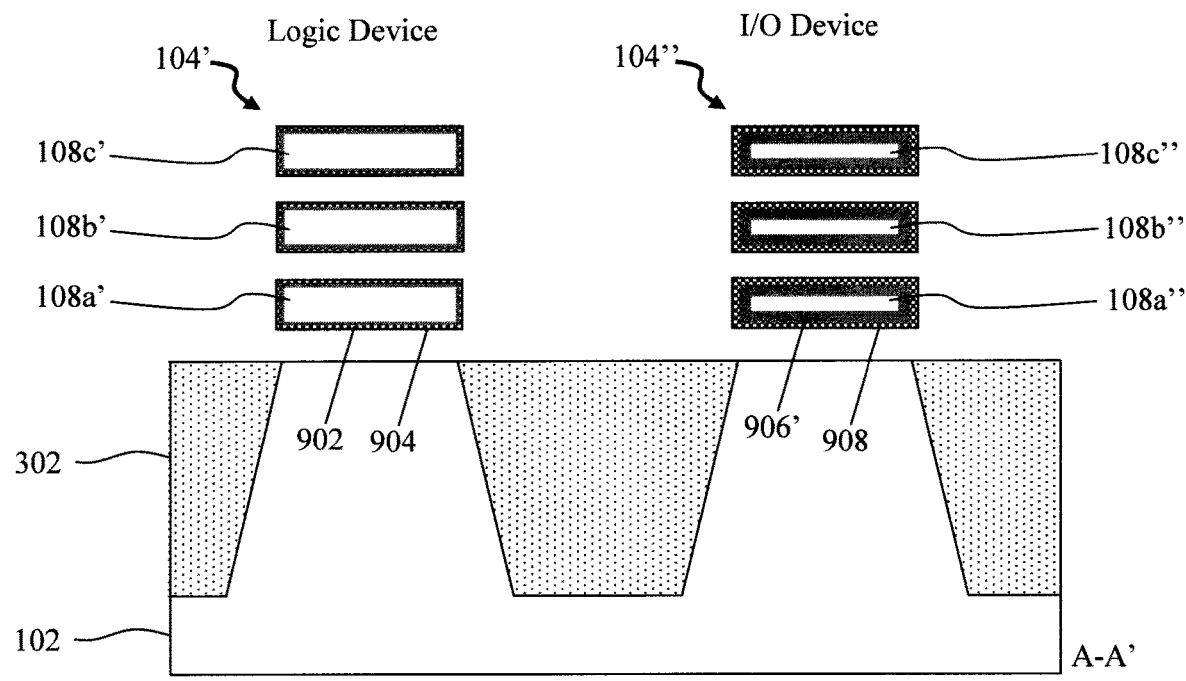
FIG. 15 is a cross-sectional diagram illustrating the sacrificial materials having been removed from the device stacks according to an embodiment of the present invention.

Following the anneal, the sacrificial materials are removed from the device stacks. Namely, as shown in FIG. 15, the sacrificial layer 1202 and barrier layer 1302 are removed from the logic device stack 104', and the oxygen containing layer 1002, sacrificial layer 1202 and barrier layer 1302 are removed from the I/O device stack 104".

A conformal gate conductor 1602 is then deposited over the gate dielectrics 904/908 in the channel regions of the logic device stack 104' and I/O device stack 104". See FIG. 16. According to an exemplary embodiment, the gate conductor 1602 is a workfunction setting metal. The particular workfunction metal employed can vary depending on whether an n-type or p-type transistor is desired. Suitable n-type workfunction setting metals include, but are not limited to, TiN, TaN and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

Figure 16:
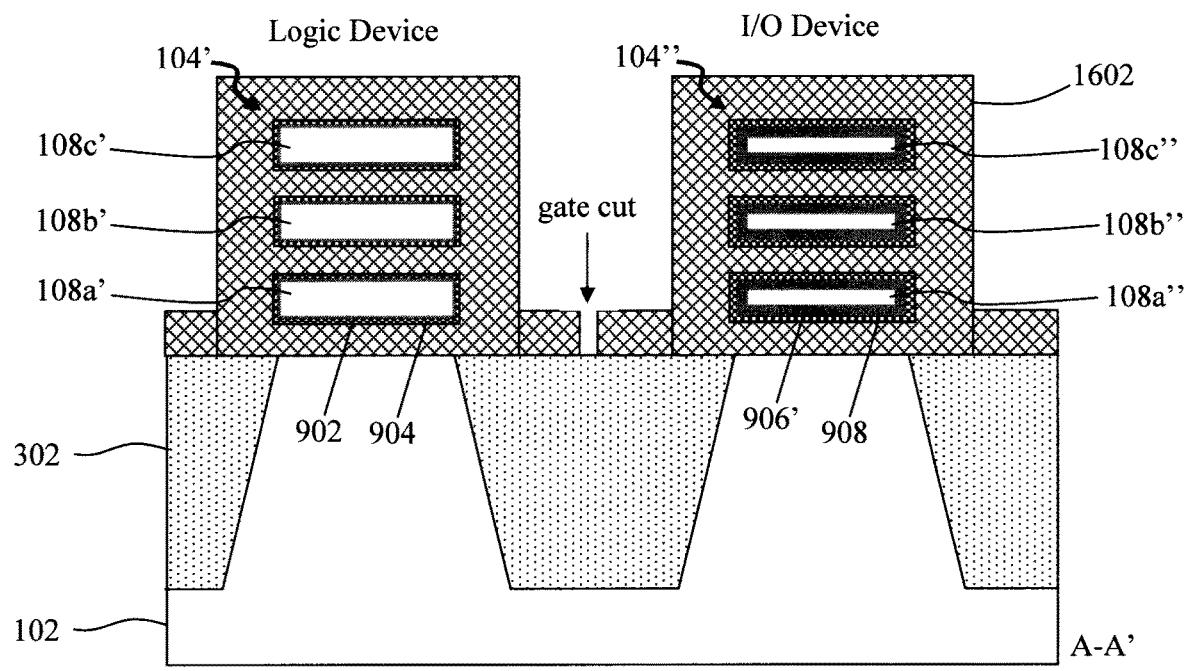
FIG. 16 is a cross-sectional diagram illustrating a conformal gate conductor having been deposited over the gate dielectrics in the channel regions of the (first) logic device stack and (second) I/O device stack according to an embodiment of the present invention.

A process such as CVD, ALD, PVD, electroplating, evaporation, sputtering, can be used to deposit the gate conductor 1602. According to an exemplary embodiment, the gate conductor 1602 is deposited to a thickness of from about 5 nm to about 20 nm and ranges therebetween. Notably, as shown in FIG. 16, the gate conductor 1602 surrounds a portion of each of the nanosheets of the channel material 108a',b',c',etc./nanosheets of the channel material 108a",b",c",etc. in a gate-all-around (GAA) configuration. As shown in FIG. 16, a gate cut can be performed to separate the gate conductor 1602 between the logic device and the I/O device.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an integrated circuit, the method comprising the steps of:
    forming device stacks on a wafer having nanosheets of a channel material, wherein the device stacks comprise at least a first device stack and a second device stack, wherein the first device stack is a logic device stack, and wherein the second device stack is an input/output (I/O) device stack;
    forming an interfacial layer (IL) oxide on the nanosheets of the channel material in the first device stack and in the second device stack;
    depositing a conformal gate dielectric on the nanosheets of the channel material in the first device stack and in the second device stack over the IL oxide;
    selectively forming an oxygen containing layer on the second device stack that pinches off a channel-to-channel space between the nanosheets of the channel material in the second device stack;
    depositing a sacrificial layer onto the nanosheets of the channel material in the first device stack and onto the oxygen containing layer in the second device stack;
    depositing a barrier layer onto and encapsulating the first device stack and the second device stack;
    annealing the first device stack and the second device stack under conditions sufficient to drive oxygen atoms from the oxygen containing layer into the IL oxide in the second device stack;
    removing i) the sacrificial layer and barrier layer from the first device stack, and ii) the oxygen containing layer, sacrificial layer and barrier layer from the second device stack; and
    depositing a conformal gate conductor over the gate dielectric in the first device stack and in the second device stack.

2. The method of claim 1, further comprising the steps of:
    forming alternating layers of the nanosheets of the channel material and a sacrificial material on the wafer;
    patterning the nanosheets into at least the first device stack and the second device stack; and
    selectively removing the nanosheets of the sacrificial material from the first device stack and from the second device stack, releasing the nanosheets of the channel material from the first device stack and from the second device stack.

3. The method of claim 2, wherein the sacrificial material comprises silicon germanium (SiGe), and wherein the channel material comprises silicon (Si).

4. The method of claim 1, wherein the oxygen containing layer comprises a metal (oxy)nitride.

5. The method of claim 4, wherein the metal (oxy)nitride is selected from the group consisting of: titanium (oxy) nitride, tantalum (oxy)nitride, and combinations thereof.

6. The method of claim 1, wherein the step of selectively forming the oxygen containing layer on the second device stack comprises the steps of:
depositing the oxygen containing layer onto the first device stack and onto the second device stack so as to surround the nanosheets of the channel material in the first device stack and in the second device stack; and
selectively removing the oxygen containing layer from the first device stack.

7. The method of claim 1, wherein the oxygen containing layer is formed having a thickness of from about 5 nm to about 15 nm and ranges therebetween.

8. The method of claim 1, wherein the sacrificial layer comprises a metal nitride.

9. The method of claim 8, wherein the metal nitride is selected from the group consisting of: metal titanium nitride (TiN), tantalum nitride (TaN), and combinations thereof.

10. The method of claim 1, wherein the barrier layer comprises a material selected from the group consisting of: poly-silicon, amorphous silicon, and combinations thereof.

11. The method of claim 1, wherein the conditions comprise a temperature of from about 850° C. to about 1050° C. and ranges therebetween.

12. The method of claim 1, wherein the conditions comprise a duration of from about 1 second to about 120 seconds and ranges therebetween.

13. The method of claim 1, wherein the conformal gate conductor comprises a workfunction setting metal selected from the group consisting of: TiN, TaN, aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

14. The method of claim 1, wherein the conformal gate dielectric comprises a high-κ gate dielectric selected from the group consisting of: hafnium oxide ($HfO_2$), lanthanum oxide ($La_2O_3$), and combinations thereof.

15. A method of forming an integrated circuit, the method comprising the steps of:
forming alternating layers of nanosheets of a channel material and a sacrificial material on a wafer;
patterning the nanosheets into at least a first device stack and a second device stack, wherein the first device stack is a logic device stack, and wherein the second device stack is an I/O device stack;
selectively removing the nanosheets of the sacrificial material from the first device stack and from the second device stack, releasing the nanosheets of the channel material from the first device stack and from the second device stack;
forming an IL oxide on the nanosheets of the channel material in the first device stack and in the second device stack;
depositing a conformal gate dielectric on the nanosheets of the channel material in the first device stack and in the second device stack over the IL oxide;
selectively forming an oxygen containing layer on the second device stack that pinches off a channel-to-channel space between the nanosheets of the channel material in the second device stack;
depositing a sacrificial layer onto the nanosheets of the channel material in the first device stack and onto the oxygen containing layer in the second device stack, wherein the sacrificial layer comprises a metal nitride;
depositing a barrier layer onto and encapsulating the first device stack and the second device stack;
annealing the first device stack and the second device stack under conditions sufficient to drive oxygen atoms from the oxygen containing layer into the IL oxide in the second device stack;
removing i) the sacrificial layer and barrier layer from the first device stack, and ii) the oxygen containing layer, sacrificial layer and barrier layer from the second device stack; and
depositing a conformal gate conductor over the gate dielectric in the first device stack and in the second device stack.

16. The method of claim 15, wherein the sacrificial material comprises SiGe, and wherein the channel material comprises Si.

17. The method of claim 15, wherein the oxygen containing layer comprises a metal (oxy)nitride selected from the group consisting of: titanium (oxy)nitride, tantalum (oxy)nitride, and combinations thereof.

18. The method of claim 15, wherein the conditions comprise a temperature of from about 850° C. to about 1050° C. and ranges therebetween, and a duration of from about 1 second to about 120 seconds and ranges therebetween.

19. An integrated circuit, comprising:
device stacks having nanosheets of a channel material disposed on a wafer, wherein the device stacks comprise at least a first device stack and a second device stack, wherein the first device stack is a logic device stack, and wherein the second device stack is an I/O device stack;
an IL oxide formed on the nanosheets of the channel material in the first device stack and in the second device stack, wherein the IL oxide formed on the nanosheets of the channel material in the first device stack has a thickness T1 and the IL oxide formed on the nanosheets of the channel material in the second device stack has a thickness T2 wherein T2>T1;
a conformal gate dielectric disposed on the nanosheets of the channel material in the first device stack and in the second device stack over the IL oxide; and
a conformal gate conductor disposed over the gate dielectric in the first device stack and in the second device stack, wherein the conformal gate conductor surrounds a portion of each of the nanosheets of the channel material in the first device stack and in the second device stack in a gate-all-around configuration.

20. The integrated circuit of claim 19, further comprising:
doped source and drain regions formed on opposite ends of the first device stack and second device stack.

* * * * *